United States Patent [19]
Narui

[11] Patent Number: 5,927,588
[45] Date of Patent: Jul. 27, 1999

[54] CONSTANT-HEAT TYPE HEATING DEVICE AND SOLDERING METHOD AND SOLDERING APPARATUS WITH HEATING DEVICE

[75] Inventor: Fumio Narui, Tokyo, Japan

[73] Assignee: KEL Corporation, Tokyo, Japan

[21] Appl. No.: 08/792,011

[22] Filed: Jan. 31, 1997

[30] Foreign Application Priority Data

| Feb. 2, 1996 | [JP] | Japan | 8-017412 |
| Feb. 2, 1996 | [JP] | Japan | 8-017413 |
| Feb. 2, 1996 | [JP] | Japan | 8-017414 |

[51] Int. Cl.$^6$ .................................................. B23K 1/00
[52] U.S. Cl. ..................... 228/6.2; 228/46; 228/180.21; 228/234.1
[58] Field of Search ............................ 228/180.21, 200, 228/234.1, 6.2, 46

[56] References Cited

FOREIGN PATENT DOCUMENTS 55-54265 4/1980 Japan ............................. 228/180.21

OTHER PUBLICATIONS

"Constant Temperature Thermode . . . ," *IBM Tech. Discl. Bull.*, vol. 31, No. 6, Nov. 1988, pp. 310–311.

*Primary Examiner*—Geoffrey Evans
*Assistant Examiner*—Jeffrey T. Knapp
*Attorney, Agent, or Firm*—Robert WJ Usher

[57] ABSTRACT

A soldering apparatus has a base composed of a base plate and a column fixed on the base plate, a heating device vertically movably mounted on the column, an operational lever for moving the heating device up and down along the column, and a table horizontally movably provided on the base plate. The heating device includes a heating member with a constant-heat source and a heating head, which is attached to the heating member. The heating head is made of a material which has a high heat conductivity, and it includes a mount portion, a contact portion, and a conductive portion. This mount portion is mounted on the heating member, and the contact portion is to touch a part to be soldered of an object. The conductive portion connects the mount portion with the contact portion and conducts heat which is supplied from the heating member to the mount portion, to the contact portion. The table is movable between a loading position and a soldering position on the base plate. At the loading position, the object is loaded or discharged, and at the soldering position, the part to be soldered of the object on the table is located under the heating head.

12 Claims, 11 Drawing Sheets

PRIOR ART

Fig. 14

PRIOR ART

CONSTANT-HEAT TYPE HEATING DEVICE AND SOLDERING METHOD AND SOLDERING APPARATUS WITH HEATING DEVICE

FIELD OF THE INVENTION

The present invention relates generally to a soldering apparatus which solders the leads of electronic components (IC chips, connectors, etc.) to electrically conductive pathways of printed circuit board on which the electronic components are placed, and particularly to a soldering method and an apparatus which uses a heater of constantly heating type as heat source.

BACKGROUND OF THE INVENTION

Figure 13:
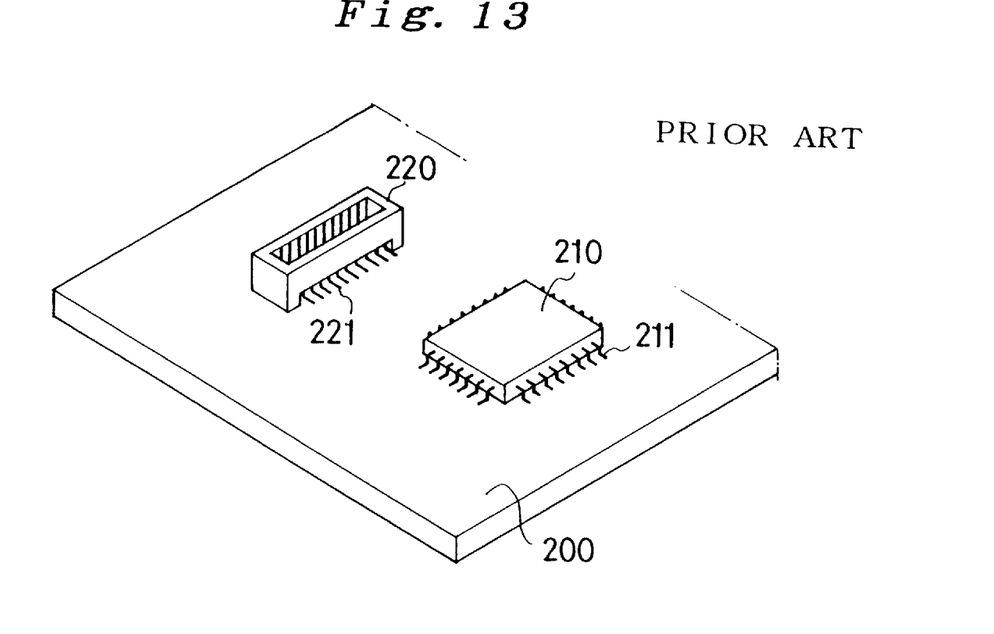
FIG. 13 is a perspective view of a printed circuit board with electronic components.

Soldering methods such as refocused and pulse dot soldering are well known, and they have been applied for electrically connecting, for example, the leads 211 and 221 of electronic components 210 and 220 to respective electrical pathways of a printed circuit board 200 as shown in FIG. 13. In the reflowing method, creamed solder is applied over the respective pathways, and then the leads of the electronic components are positioned. This printed circuit board mounted with the electronic components is heated in a furnace to fuse the creamed solder and thereby to join the leads to the pathways.

The reflowing method has an advantage of high productivity since a lot of electronic components can be soldered on a printed circuit board in one process. However, it has some disadvantages. As the printed circuit board and the electronic components mounted thereon are all heated up, the circuit board tends to warp from the heating, and the method is applicable only for soldering electronic components which have heat resistance up to the melting point of the solder. In addition, it presents a possibility of soldering defect. If one or more of the leads of the electronic components are deformed such that some leads stay above and off from respective electrically conductive pathways of the circuit board when the components are mounted on the board (a case shown with a lead 211a in FIG. 14), then they are not soldered.

Figure 14:
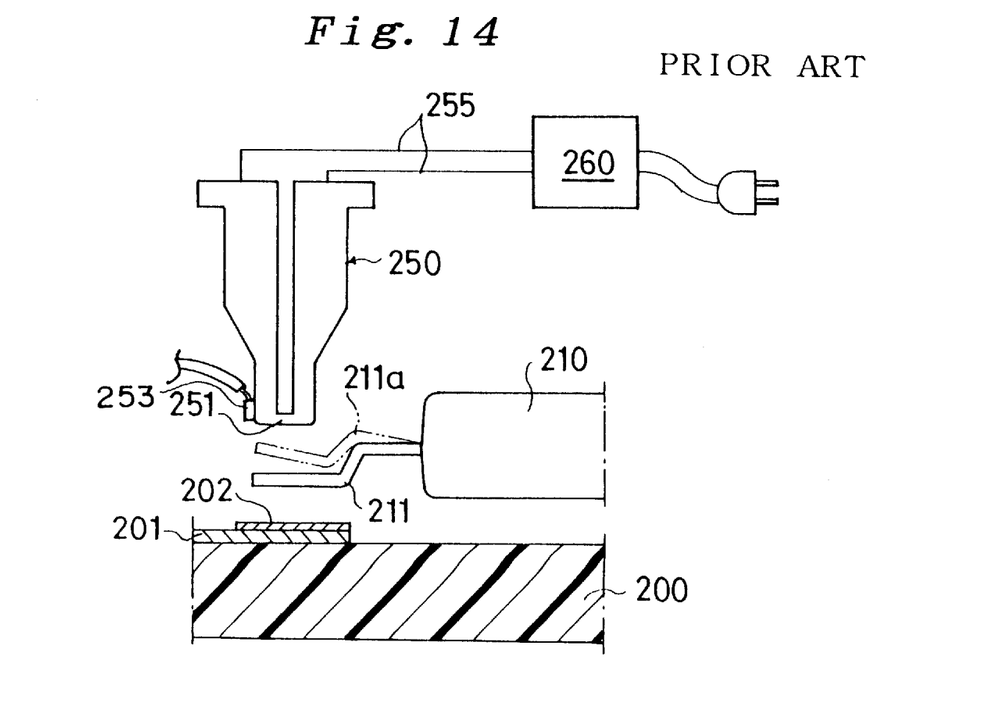
FIG. 14 is a schematic view of a pulse dot soldering apparatus of prior art.

On the other hand, the pulse dot soldering method never experiences this kind of soldering defect since a pulse dot soldering iron is pressed on each lead to heat precisely a part to be soldered without overheating adjacent parts. As shown in FIG. 14, the pulse dot soldering iron 250 extends vertically and thins out downward with a contact portion 251 at its lower end, and it receives a large electrical current at a low voltage (e.g., 1,000 A at 3 V) through a wire 255 from a current control unit 260. This electrical current spot-heats the contact portion 251, which has the smallest sectional area and thus the largest electrical resistance. The contact portion 251 after being heated up is pressed downward against the lead 211 to solder it.

In preparation for this soldering, creamed solder 202 (i.e., preparation solder or pre-fusion solder) is applied to electrically conductive pathways 201 of the circuit board 200, and the leads 211 of the electronic component 210 are coated with solder (or plated with gold). Then, after the leads 211 are positioned on the pathways 201, the contact portion 251 is pressed down on each lead 211 to fuse the solder and thereby to join the lead to the respective pathway. In this case, the circuit board 200 is heated only at the leads, so there is no risk of the circuit board 200 deforming from heat. In addition, the pulse dot soldering has an advantage that such deformed lead 211a as described above can be soldered without defect because the contact portion 251 presses the lead 211a to its original or non-deformed condition.

However, the whole apparatus operating the pulse dot soldering iron 250 is large and expensive because it uses a large electrical current, requiring a thick wire 255 with a large electrical capacity, and a complex and expensive current control unit 260. In addition, the pulse dot soldering presents another problem. Since the contact portion 251, through which a large current flows, is pressed onto each lead 211 of the electronic component 210, there is a risk of damaging the component 210.

Since the pulse dot soldering iron 250 must have a small sectional area for the contact portion 251 and a thick wire for electrical current, the shape of the soldering iron 250 does not allow much modification for complexity. Therefore, only one row of leads can be heated in one soldering process by the pulse soldering iron of a soldering apparatus which has only one electrical current source. The electronic component 210 shown in FIG. 13, for example, has four rows of leads 211 in a square. If such electronic components 210 are to be mounted on the circuit board 200, the soldering process must be repeated four times for each component. This is not productive and cost-effective.

Although deformed leads 211a can be soldered as described previously with reference to FIG. 14, this requires that the contact portion 251 be raised after the solder has resolidified. If the contact portion 251 were raised while the solder is still fused, then a lead 211a which has a deformation might peel off from the pathway 201 because of resiliency, causing a defect in the soldering. Therefore, the contact portion 251 is kept pressed to the leads 211 even after the current heating the contact portion 251 is cut off. The temperature of the contact portion 251 is let to decline so that the solder resolidifies before the pulse dot soldering iron 250 is raised to complete the soldering. As such, this system needs to detect the temperature of the contact portion 251, so a thermocouple 253 is provided near the lower end of the pulse dot soldering iron 250, for example, by welding.

When the current flows, only the contact portion 251, which is located at the lower end of the pulse dot soldering iron 250, is heated. Therefore, after the start of the current, the time required for this lower end to attain a predetermined temperature is relatively short. Likewise, after the cutting of the current, the time required for the lower end to regain the original lower temperature is relatively short (about 5 or 6 seconds). Thus, the soldering process can be carried out in a relatively short period. This is a major advantage of the pulse dot soldering.

If this soldering process only involved heating and melting the solder applied at the leads, then it could be carried out by a heater which generates a constant heat (e.g., heater of Nichrome wire) instead of a pulse dot soldering iron. The system would be more advantageous with a constant-heat type heater than with a pulse dot soldering iron because it could be constructed less expensively and controlled more easily. However, in the system with a constant-heat type heater, the whole heating head of the heater is heated, so it takes a long time for the heating head to cool down. If this heating head were pressed to the leads to fuse the solder, then it would take a relatively long time for the heating head to cool down and for the solder to resolidify after the cutting off of the current. Thus, the system would require a long processing time. This is a major reason why a constant-heat type heater has not been used in this type of soldering apparatus.

SUMMARY OF THE INVENTION

It is an object of the present invention to provide a heating device with a constant-heat source, a soldering method, and a soldering apparatus.

Another object of the present invention is to provide a soldering method and an apparatus which, with a constant-heat source, realize the same soldering method of pulse dot soldering.

Another object of the present invention is to provide a soldering method and an apparatus which has a simple and inexpensive structure.

A further object of the present invention is to provide a soldering method and an apparatus in which no current flows through an object to be soldered during soldering.

Yet another object of the present invention is to provide a soldering method and an apparatus in which a plurality of heating heads are employed so that a plurality of parts are soldered in one soldering process to achieve a high efficiency.

Still further object of the present invention is to provide a soldering method and an apparatus in which a soldering process is performed in a short period of time with a constant-heat source.

In order to achieve these objectives, a soldering apparatus of the present invention comprises a base composed of a base plate and a column, the column being fixed on this base plate, a heating device vertically movably mounted on the column, lowering/raising means for moving the heating device up and down along the column, and a table horizontally movably provided on the base plate. The heating device includes a heating member with a constant-heat source and a heating head, which is attached to the heating member. The heating head is made of a material which has a high heat conductivity, and it includes a mount portion, a contact portion, and a conductive portion. The mount portion is mounted on the heating member, and the contact portion comes into contact with a part of an object to be soldered. The conductive portion is formed connecting the mount portion with the contact portion and conducts heat which is supplied from the heating member to the mount portion, to the contact portion. The table is movable between a loading position and a soldering position on the base plate, the loading position being where the object is loaded or discharged, and the soldering position being where the part to be soldered of the object on the table is located under the heating head.

In soldering with this apparatus, the table is first loaded with the object at the loading position and then transferred to the soldering position. With the object on the table at the soldering position, the heating device is lowered by the lowering/raising means. Thus, the contact portion of the heating device touches the part of the object, melts solder and solders the part. In this case, when the contact portion touches the part to be soldered, heat from the contact portion flows into the part. As a result, the solder melts, and the temperature of the contact portion declines, causing the solder to resolidify. When the solder has turned into solid again, the heating device is lifted upward by the lowering/raising means to complete the soldering process.

Preferably, this soldering apparatus may include controlling means for controlling the operation of the lowering/raising means. While the table with the object is positioned at the soldering position, the controlling means lowers the heating device, making the contact portion touch the part to be soldered. As a result, the solder melts. After the contact portion has cooled down to a temperature below the melting point of the solder because of heat transfer from the contact portion to the part, the controlling means lifts the heating device to complete the soldering process. Thus, the solder which has once melted resolidifies while the contact portion is still touching the part. In this way, the soldering is securely carried out.

It is preferable that the capacity of the constant-heat source and the shape of the heating head be designed such that when the heat supplied from the heating member to the mount portion and the heat radiating from the heating head balance while the contact portion is in the air, the temperature of the contact portion is above the melting point of the solder applied to the part to be soldered, and that when the heat supplied from the heating member to the mount portion, the heat radiating from the heating head and the heat conducted from the contact portion to the part to be soldered balance while the contact portion is touching the part to be soldered, the temperature of the contact portion is below the melting point of the solder. In this case, after the solder has been melted by the contact of the contact portion, it resolidifies when the latter balance is achieved with an elapse of time before the heating head is lifted. In this way, the soldering is securely carried out.

It is also preferable that the apparatus further comprise cooling means for cooling at least the vicinity of the contact portion in the heating head. In this case, after the solder has been melted by the contact of the contact portion with the part to be soldered, it resolidifies when the vicinity of the contact portion is cooled by the cooling means. Then, the heating head is lifted to complete the soldering process.

In addition to this cooling means, the apparatus may include controlling means for controlling the operation of the lowering/raising means. In this case, while the table with the object is positioned at the soldering position, the controlling means lowers the heating device. Thus, the contact portion touches the part and melts the solder. The solder resolidifies when the cooling means cools the vicinity of the contact portion. After this resolidification, the controlling means lifts the heating device to complete the soldering process.

The soldering method of the present invention carries out soldering by making the contact portion touch a part to be soldered so as to melt solder. First, the heating member is heated by the constant-heat source. After the contact portion has heated to a first predetermined temperature which is higher than the melting point of the solder, the heating head is moved so that the contact portion touches the part to be soldered. After the solder at the part has melted, at least the vicinity of the contact portion in the heating head is cooled by the cooling means. After the contact portion has cooled to a second predetermined temperature which is lower than the melting point of the solder, the heating head is moved so that the contact portion leaves the part, completing the soldering.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only and thus are not limitative of the present invention and wherein.

DETAILED DESCRIPTION OF THE PREFERRED EMBODIMENTS

First Embodiment

Figure 1:
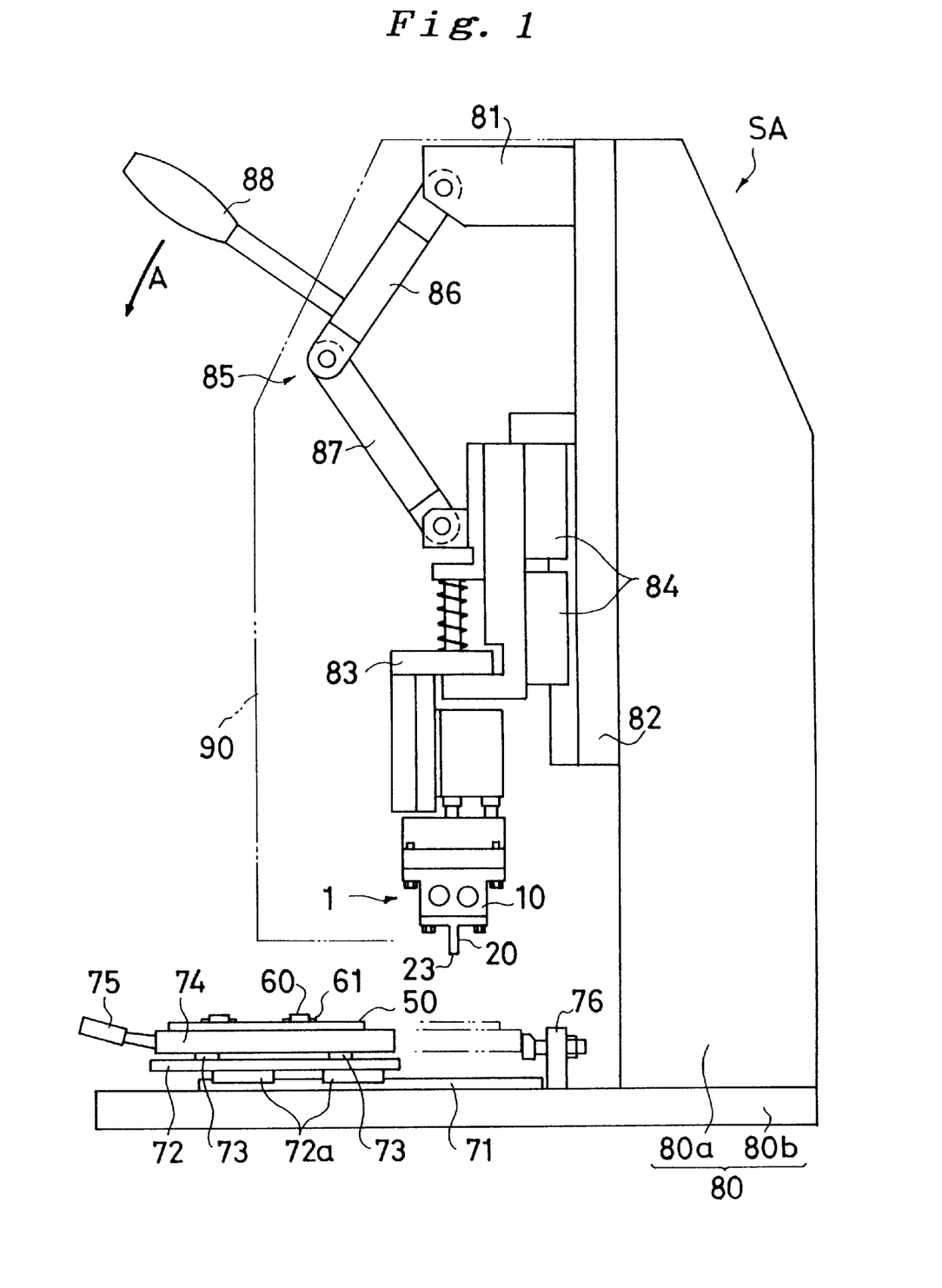
FIG. 1 is a lateral view of a soldering apparatus according to the present invention.
Figure 2:
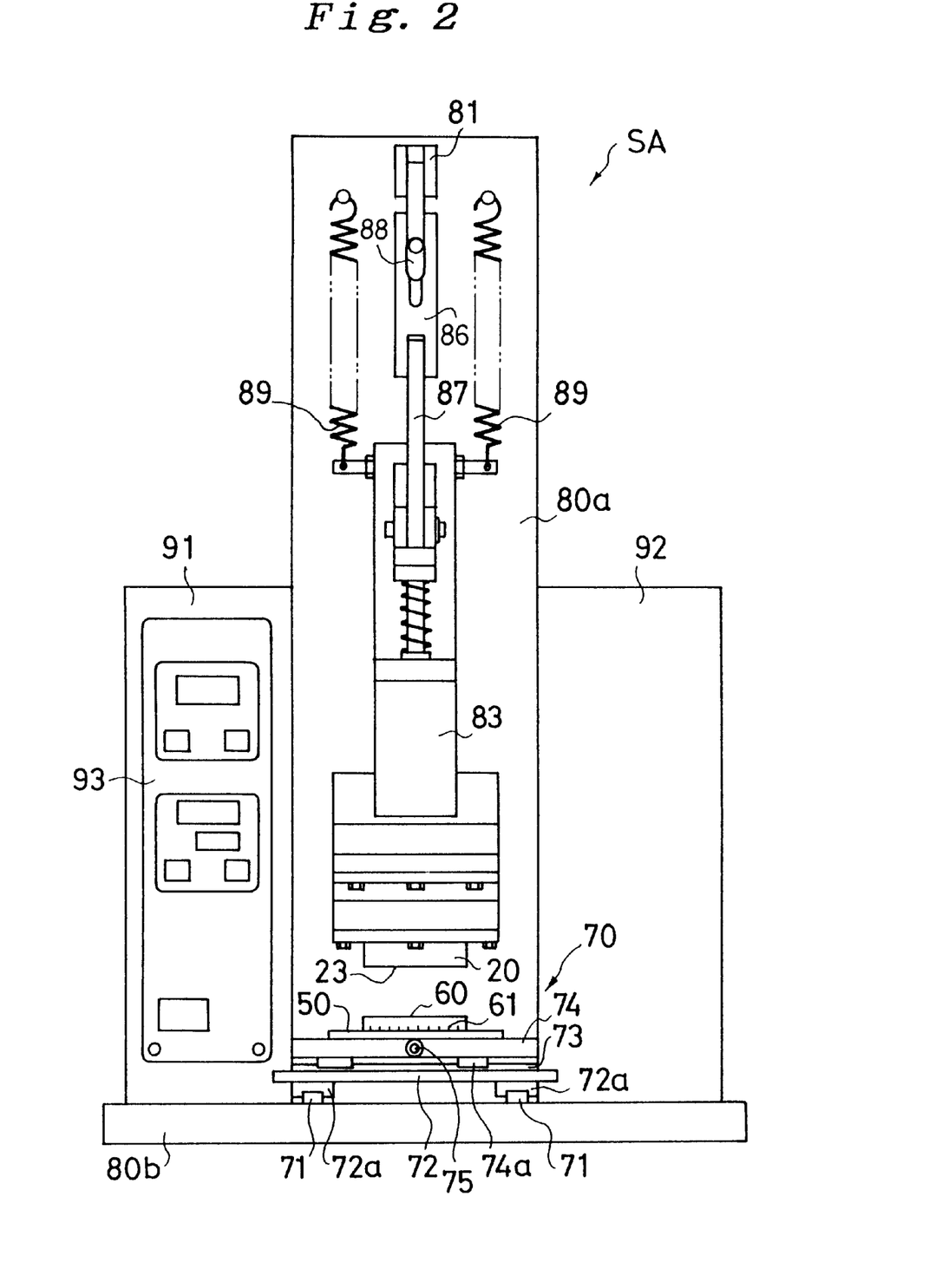
FIG. 2 is a frontal view of the soldering apparatus.

Preferred embodiments of the present invention are described in the following with reference to the drawings. FIGS. 1 and 2 show the whole structure of a soldering apparatus SA as a first embodiment in accordance with the present invention. This soldering apparatus SA includes a base 80 composed of a horizontal base plate 80b and a vertical column 80a standing on the base 80b.

A vertical guide rail 82 is provided on the front face of the column 80a, and a pair of up-and-down sliders 84 are provided on the guide rail 82. On these sliders 84, mounted is a vertically sliding member 83 capable of sliding along the guide rail 82. A heating device 1, which includes a heating member 10 and a heating head 20, is provided at the lower end of this sliding member 83. In addition, a manually operated, vertical transfer mechanism 85 is provided between the sliding member 83 and a support 81 which is provided at the upper end of the column 80a.

The vertical transfer mechanism 85 includes two links 86 and 87. One end of the upper link 86 is pivotally connected to the support 81, and the other end is pivotally connected to one end of the lower link 87, whose other end is pivotally connected to the sliding member 83. To the upper link 86, an operational lever 88 is fixed protruding forward so that it is operated in the direction marked with arrow A to lower the sliding member 83. Furthermore, a lateral pair of tension springs 89 are provided between the sliding member 83 and the column 80a so that the sliding member 83 is biased upward by the tension springs 89. Unless the operational lever 88 is operated, the sliding member 83 is kept at the upper end of its stroke.

On the upper face of the base plate 80b, a lateral pair of guide rails 71 are provided extending rearward. To-and-fro sliders 72a are mounted on the guide rails 71, and a mediate plate 72 is then mounted on these sliders 72a. Furthermore, a pair of lateral guide rails 73, which extend laterally, are provided on the mediate plate 72. Moreover, lateral sliders 74a are mounted on these lateral guide rails 73, and a table 74 is provided on the lateral sliders 74a. As such, the table 74 is capable of being transferred right and left, and back and forth.

Since a printed circuit board 50, to which an electronic component 60 is to be soldered, is placed and positioned on this table 74, the table 74 is provided with a handle 75, with which the table 74 is easily transferred right and left, and back and forth. In addition, a positioning stopper 76 is provided on the base plate 80b such that the table 74 is easily positioned at a right position for soldering.

The front of the column 80a is covered with a cover 90, and boxes 91 and 92, which accommodate various components, are provided on the right and left of the column 80a. On the front of one 91 of the boxes, provided is a panel 93, which includes various switches, temperature indicators, etc.

Figure 3:
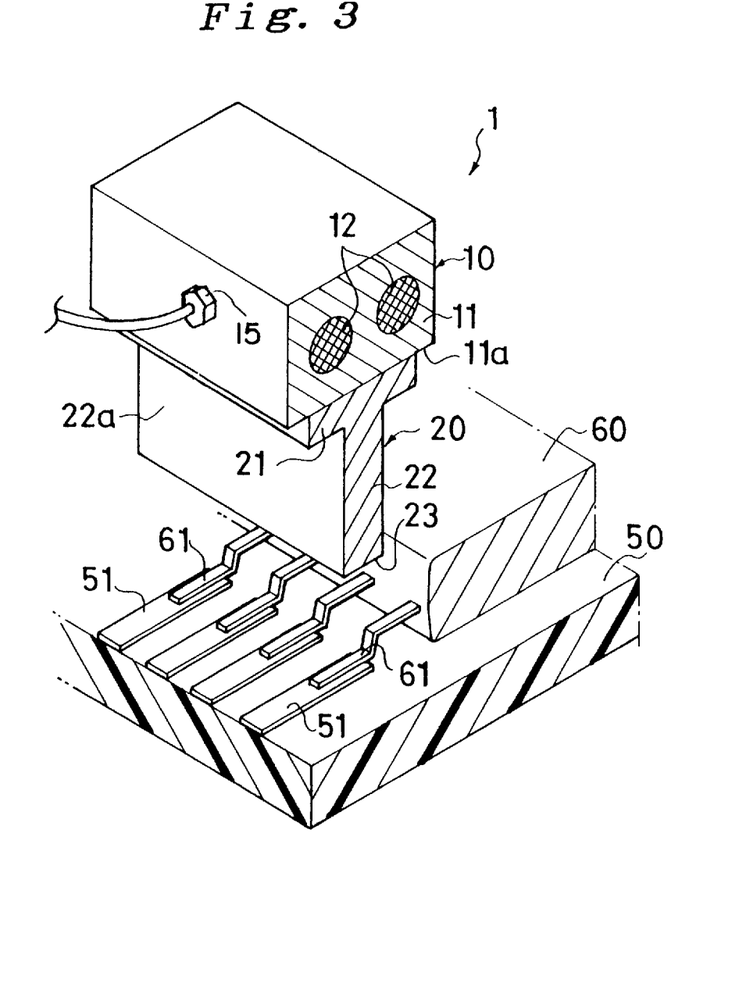
FIG. 3 is a sectional, perspective view showing a heating device of the soldering device and a printed circuit board, which is to be soldered.
Figure 4A:
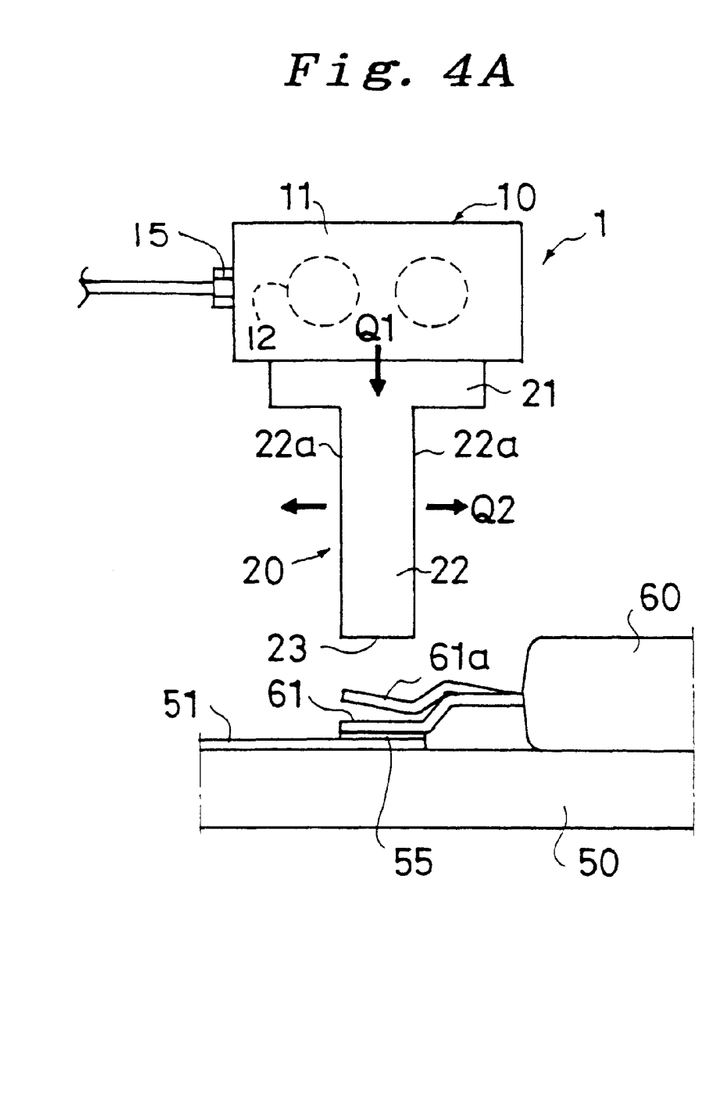
FIG. 4A is a frontal view of the soldering apparatus, showing a condition before soldering.
Figure 4B:
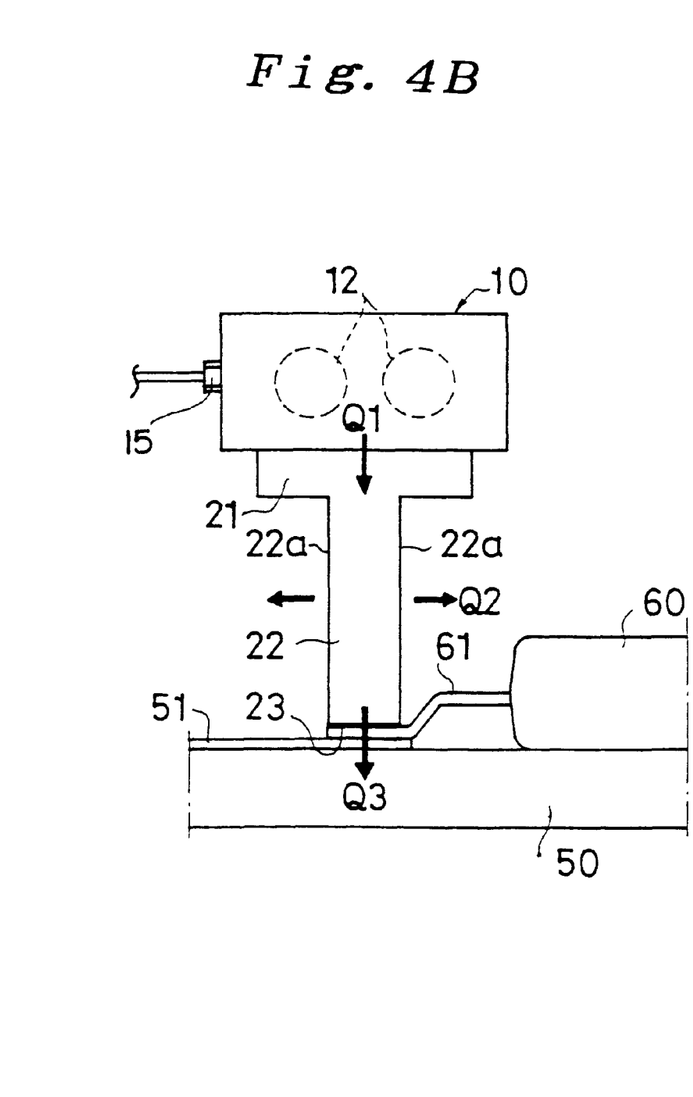
FIG. 4B is a frontal view of the soldering apparatus, showing a condition during soldering.

The operational lever 88 is operated to lower the heating device 1 along with the sliding member 83 in this soldering apparatus SA. In this operation, a contact face 23, which is located at the lower end of the heating head 20 in the heating device 1, touches leads 61 of the electronic component 60 placed on the printed circuit board 50 to melt the solder and to connect the leads 61 to respective electrically conductive pathways 51 of the printed circuit board 50. The heating device 1 is further described with reference to FIGS. 3 and 4.

The heating member 10 of the heating device 1 comprises a rectangular body 11 made of aluminum and two constant heat sources 12 provided in the body 11. The heat sources 12 are ordinary heaters composed of Nichrome wire, and they are operated to produce heat by an electrical current of about 3A at 100 V. A thermocouple 15 is provided on a side of the body 11 to detect the temperature of the heating member 10. The heating head 20 is made of either aluminum, an aluminum alloy or the like so as to possess a high heat conductivity, and it is formed in a cross-sectional figure of "T" with a mount portion 21 at the upper portion thereof, a conductive portion 22 extending downward on the center of the mount portion 21, and the contact face 23 at the lower end. The mount portion 21 is attached to the lower face of the heating member 10; the conductive portion 22 has lateral heat-radiating faces 22a; and the contact face 23 is to touch the part to be soldered.

As shown in FIG. 4A, the heating head 20 is attached on the lower face of the heating member 10. Here, a heat balance is analyzed for the condition where the contact face 23 of the heating head 20 is sustained in the air (i.e., not touching the part to be soldered). In this condition, heat Q1 is supplied to the heating head 20 through the mount portion 21 from the heating member 10, which is heated by the heat sources 12, and some heat Q2 radiates from the heating head 20, mainly from the heat-radiating faces 22a. As the temperature of the heating head 20 rises, the heat Q1 supplied from the heating member 10 becomes smaller, and the heat Q2 radiating from the heating head 20 becomes larger. When the temperature of the heating head 20 reaches a predetermined temperature, the heat Q1 and the heat Q2 balance. The power of the heat sources 12 and the shape of the heating head 20 are designed such that the temperature T1 of the contact face 23 is above the melting point of the solder (e.g., about 180~200 degrees C.) at this balance.

Figure 5A:
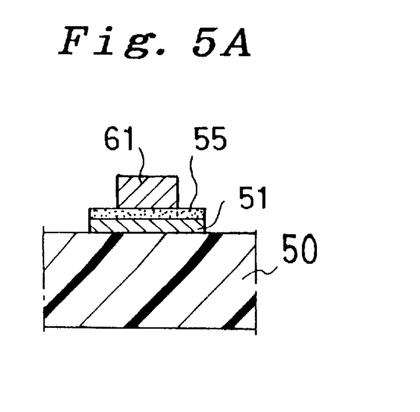
FIG. 5A is a sectional view showing a lead of an electronic component before soldering, which is placed on an electrically conductive pathway of the printed circuit board.

As shown in FIG. 5A, creamed solder 55 (preparatory solder or pre-fusion solder) is applied to, electrically conductive pathways printed on the printed circuit board 50, and the leads 61 of the electronic component 60 are placed on this solder layer 55. Then, the operational lever 88 is operated in the direction indicated by arrow A in FIG. 1 to lower the heating head 20, in which the heat Q1 supplied and the heat Q2 radiating are balanced as described above. When the heating head 20 is lowered, the contact face 23 is pressed on to the lead 61 as shown in FIG. 4B. In this instance, some heat Q3 is transferred to the solder 55 through the leads 61, melting the solder 55.

Here, at this point, the heat released from the heating head 20 increases by the amount of the heat Q3 conducted through the leads 61 because the leads 61 and the pathways 51 are made of metal and have a heat conductivity much higher than that of the air. When the heat Q1 supplied, the heat Q2 radiated and the heat Q3 conducted are balanced, the contact face 23 has a temperature T2 which is lower than the temperature T1 attained while the contact face 23 is in the air. The power of the heat sources 12 and the material and shape of the heating head 20 are designed such that the temperature T2 is below the melting point of the solder.

Figure 5B:
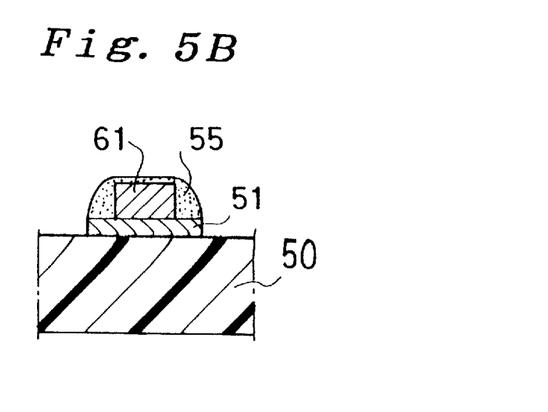
FIG. 5B is a sectional view showing the lead after soldering.

In the condition where the heat Q1 supplied, the heat Q2 radiated and the heat Q3 conducted are balanced, the solder resolidifies. In this condition, the heating head 20 is raised to complete the soldering. FIG. 5B shows the result of the soldering. The resolidified solder 55 surrounds the leads 61, forming a fillet, and thereby securely soldering the leads 61 to the pathways 51.

Figure 6:
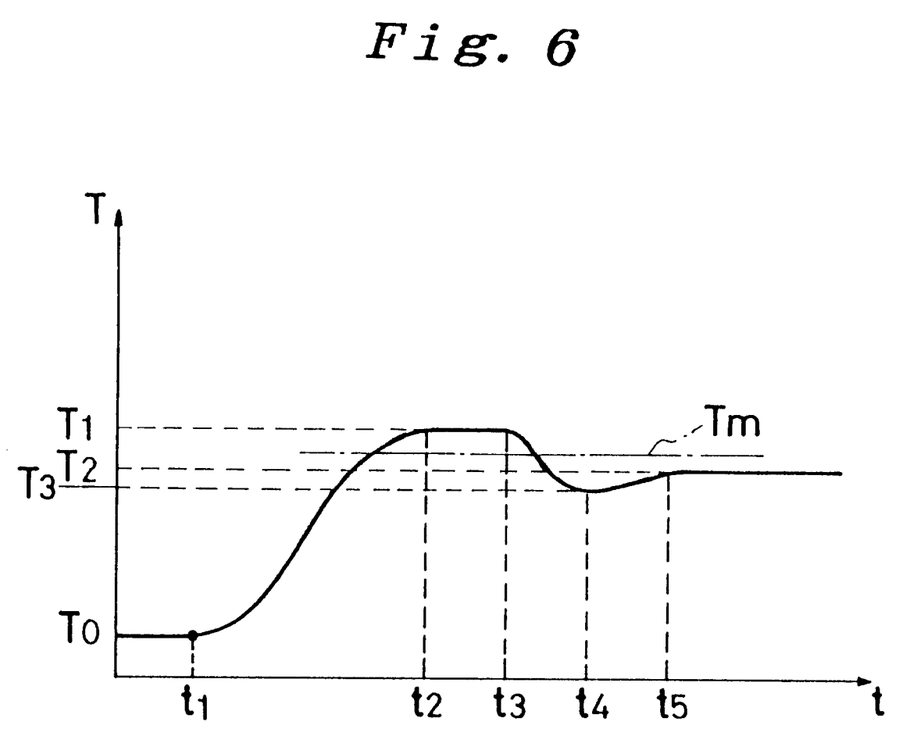
FIG. 6 is a graph showing changes in the temperature of the contact face of the heating device during soldering.

A soldering process using this soldering apparatus SA is described in the following. FIG. 6 shows changes in the temperature of the contact face 23 during the soldering process. In this graph, the elapse of time is indicated in the abscissa, and the changes in the temperature T of the contact face 23 are indicated in the ordinate.

First, a heater power switch, which is provided on the front panel 93, is turned on to start an electrical current to the heat sources 12 (at time t1). The heat sources 12 generate heat heating the heating head 20. As a result, the temperature of the contact face 23 rises. While the contact face 23 is kept in the air, the temperature of the contact face 23 reaches the temperature T1, which is above the melting point Tm of the solder (at time t2) when the heat Q1 supplied and the heat Q2 radiating are balanced.

Meanwhile, the handle 75 is held and pulled forward by the operator so that the table 74 is positioned at a loading position. Then, the printed circuit board 50 is mounted on the table 74, and the electronic component 60 is placed at a predetermined position on the printed circuit board 50. The creamed solder 55 has been applied to the electrically conductive pathways 51 of the printed circuit board 50 by this time, and each lead 61 of the electronic component 60 is positioned on the creamed solder 55 above a respective pathway 51 as shown in FIG. 5A. Then, the handle 75 is operated to move the table 74 to the stopper 76. Where the table 74 reaches the stopper 76 defines a position at which the soldering is actually carried out. At this soldering position, a row of leads 61 to be soldered are directly below the contact face 23 of the heating head 20.

When the operator watching a temperature indication on the panel 93 sees that the temperature of the contact face 23 has reached the above mentioned temperature T1, he operates the operational lever 88 in the direction indicated with arrow A (at time t3). This operation lowers the heating head 20 along with the sliding member 83 and the heating member 10. As a result, the contact face 23 comes into contact with the leads 61 of the electronic component 60 on the printed circuit board 50.

With this contact, the heat Q3 is conducted from the contact face 23 to the leads 61, melting the solder 55. Because of this conduction, the temperature of the contact face 23 decreases to a temperature T3 (at time t4) and then increases a little to the temperature T2 at which the heat Q1 supplied, the heat Q2 radiated and the heat Q3 conducted balance with one another (at time t5). As the temperature of the contact face 23 changes in this way, the solder 55, which has been melted, resolidifies as shown in FIG. 3B. As such, the operator operates the operational lever 88 to raise the heating head 20 when the temperature of the contact face 23 decreases to the temperature T3 or returns to the temperature T2.

In this embodiment, the temperature T2 at which the heat Q1 supplied, the heat Q2 radiating and the heat Q3 conducted balance is below the melting point Tm of the solder. However, the present invention is not limited to this. For example, the temperature T2 can be set a little above the melting point Tm while the temperature T3 which is attained when the contact face 23 comes into contact with the leads 61 is set below the melting point Tm. In this case, the heating head 20 is raised to complete the soldering when the contact face 23 cools down to the temperature T3, letting the solder resolidify.

After the contact face 23 has reached the leads 61 and melted the solder, it takes a short time for the temperature of the contact face 23 to decrease to the temperature T3 or T2. Therefore, even though the apparatus of this embodiment uses a constant-heat type heater as heat source, the soldering process is efficiently carried out within a short time.

Since the contact face 23 of the heating head 20 is pressed to the leads 61 in the soldering process, the soldering is completed without any fault even if some leads 61a are deformed in such a way as shown in FIG. 4A. Deformed leads 61a are kept to the pathways 51 by the contact face 23 as shown in FIG. 4B while the solder 55 melts and then resolidifies. Therefore, the deformed leads 61a are securely soldered to the pathways 51, and they remain so after the contact face 23 of the heating head 20 is raised away from the leads 61.

Figure 7A:
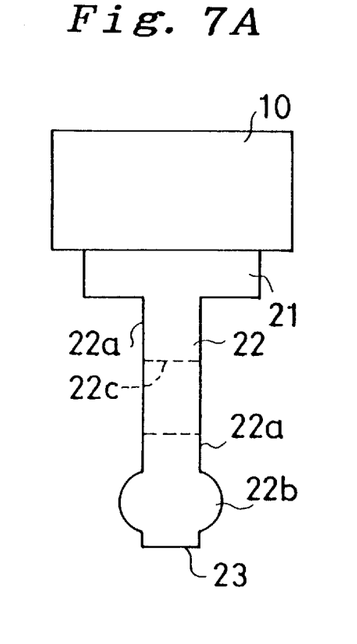
FIG. 7A is a frontal view of another heating device according to the present invention.
Figure 7B:
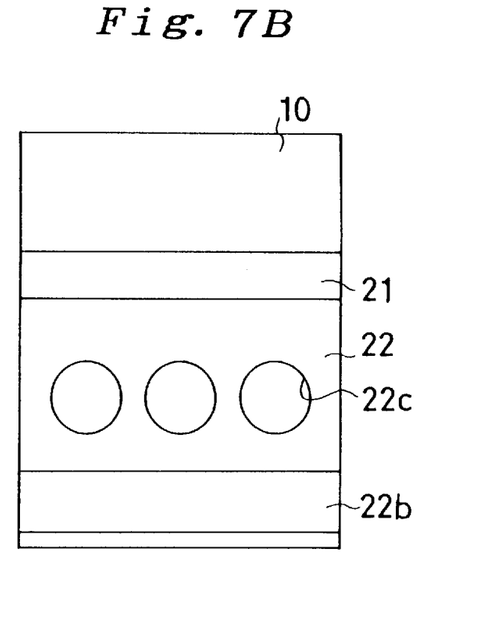
FIG. 7B is a lateral view of this heating device.

However, there is a concern that the solder 55 may not melt sufficiently because the contact face 23 cools down rapidly after it touches the leads 61. In some cases, the heat Q3 initially transferred to the solder 55 when the contact face 23 touches the leads 61 may not melt the solder 55 enough to secure the soldering. To remove this possibility, a heat storage portion 22b can be provided in an inflated shape to the heating head 20 immediately above the contact face 23 as shown in FIGS. 7A and 7B so that the heat stored in this heat storage portion 22b supplements the heat Q3 transferred to the solder 55, securing the melting of the solder 55. Also, the heat Q2 radiating from the heat-radiating faces 22a can be adjusted by providing adjuster bores 22c in the heating head 20.

Figure 8:
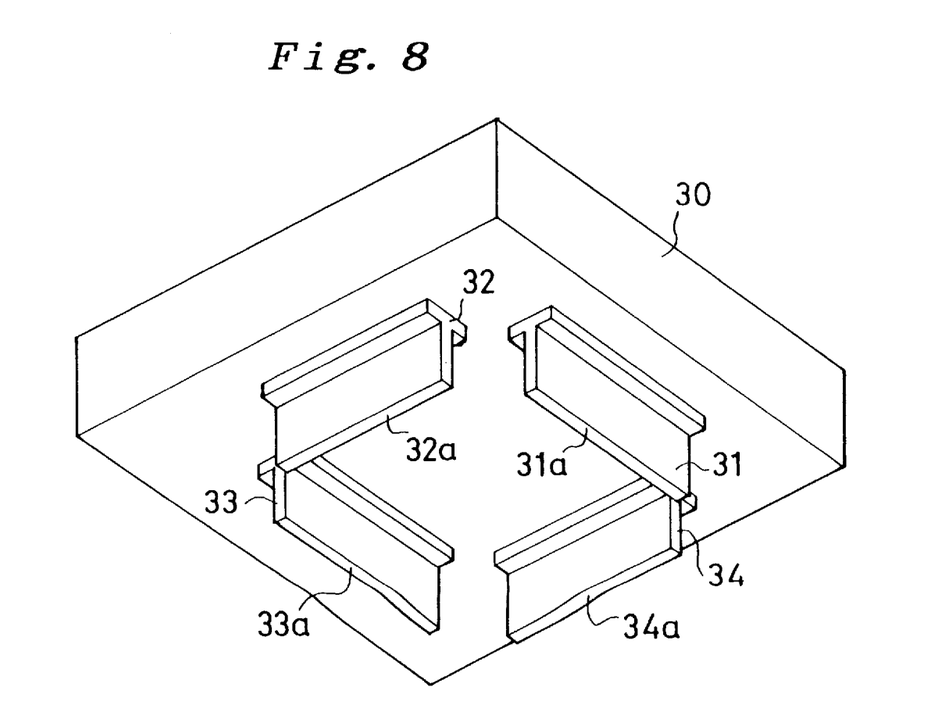
FIG. 8 is a perspective view of yet another heating device.

In the above embodiment, the heating head 20 is designed to solder one row of leads 61. However, the apparatus can be arranged to solder a plurality of rows of leads in one soldering process. For example, four heating heads 31, 32, 33 and 34 can be attached to the lower face of the heating member 30 in a square arrangement as shown in FIG. 8. The four rows of leads surrounding the electronics component can be soldered at once with the contact faces 31a, 32a, 33a and 34a of these heating heads. Or, instead of using four such heating heads, the heating head itself can be formed to incorporate four contact faces. Moreover, the shape of the heating head is not limited to a square. It can be shaped in any figure freely to accommodate for the specific need of an object to be soldered.

In the pulse dot soldering, the heating head, i.e., the pulse dot soldering iron, is not easily removed from or attached to the apparatus because it is an electrode through which an electrical current flows to generate heat. In the present invention, the heating head is easily replaceable because it is only an attachment to the heating member. By replacing heating heads, electronic components of various shapes are easily soldered with the apparatus of the present invention. Furthermore, in the present invention, there is no risk of electricity accidentally flowing into the electronic component since the heating head is not supplied with an electrical current. In addition, the thermocouple is not attached to the heating head but to the heating member in the present invention while the temperature of the heating head is still detectable. Because of this arrangement, there is no need to replace the thermocouple when the heating head is replaced. This also contributes to the ease of replacement of the heating head.

Second Embodiment

Figure 9:
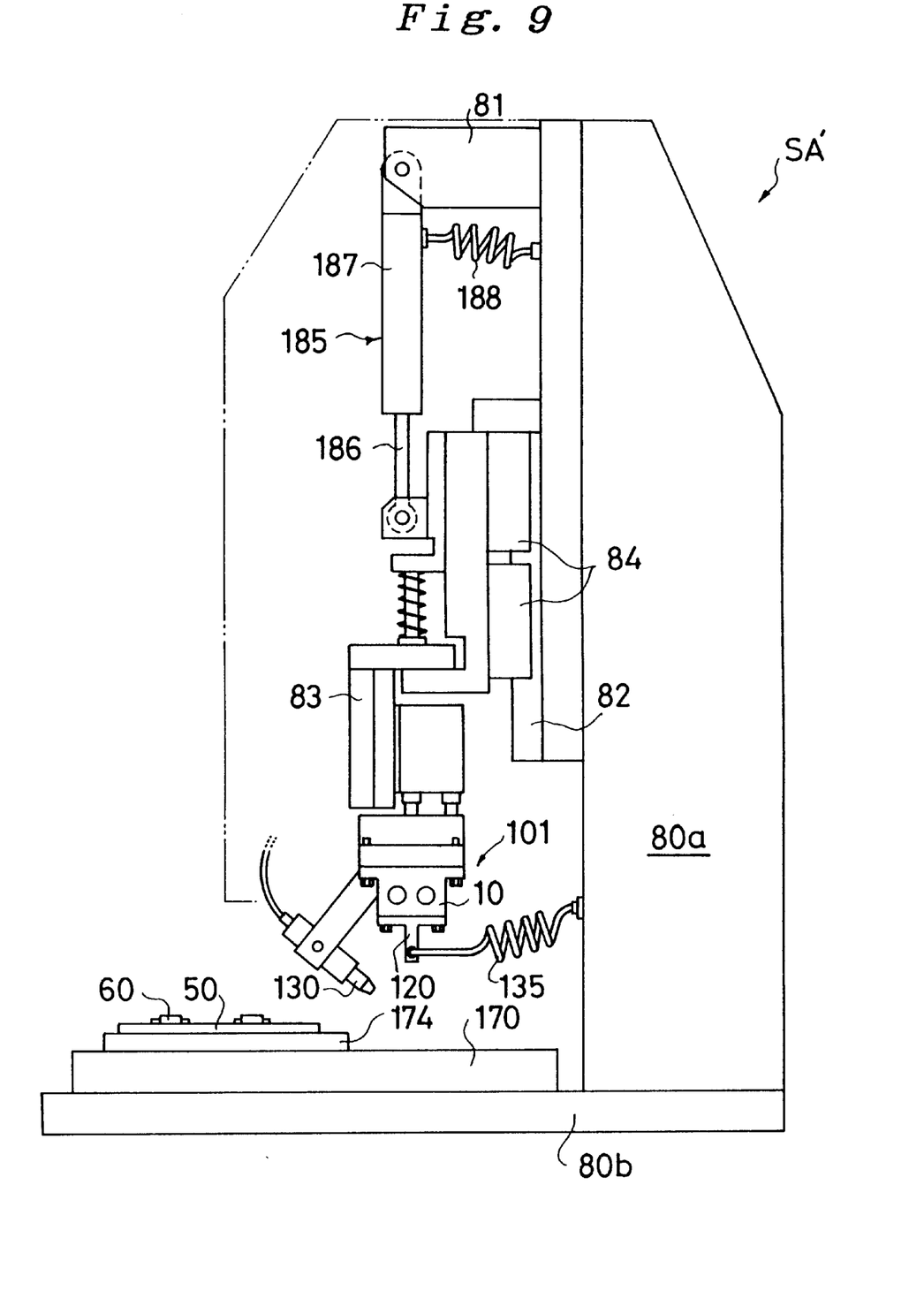
FIG. 9 is a lateral view of another soldering apparatus according to the present invention.

Now, another soldering apparatus SA' is described as a second embodiment of the present invention with reference to FIG. 9. This soldering apparatus SA' is similar to the soldering apparatus SA shown in FIGS. 1 and 2. Therefore, identical parts of the apparatus SA' are given the same number as in FIGS. 1 and 2 so as to leave out detailed description. This apparatus SA' includes a base 80 composed of a column 80a and a base plate 80b, a vertical guide rail 82, a sliding member 83 and up-and-down sliders 84, all of which are provided in the same way as in the soldering apparatus SA. A heating device 101 is provided at the lower end of the sliding member 83, and it includes a heating member 10 and a heating head 120.

A pneumatic cylinder 185 comprising a rod 186 and a housing 187 is provided between the support 81 and the sliding member 83 for lowering and raising the sliding member 83. The rod 186 is pivotally connected to the sliding member 83, and the housing 187 is pivotally connected to the support 81. The rod 186, which is extendable by the pressure supplied to the housing 187 through a pipe 188, transfers the sliding member 83 vertically along the column 80a.

An X-Y transfer device 170 is provided on the base plate 80b, and the X-Y transfer device 170 supports a table 174. As such, the table 174 is transferred right and left, and back and forth on a horizontal plane. On this table 174, a printed circuit board 50 is mounted.

Figure 10:
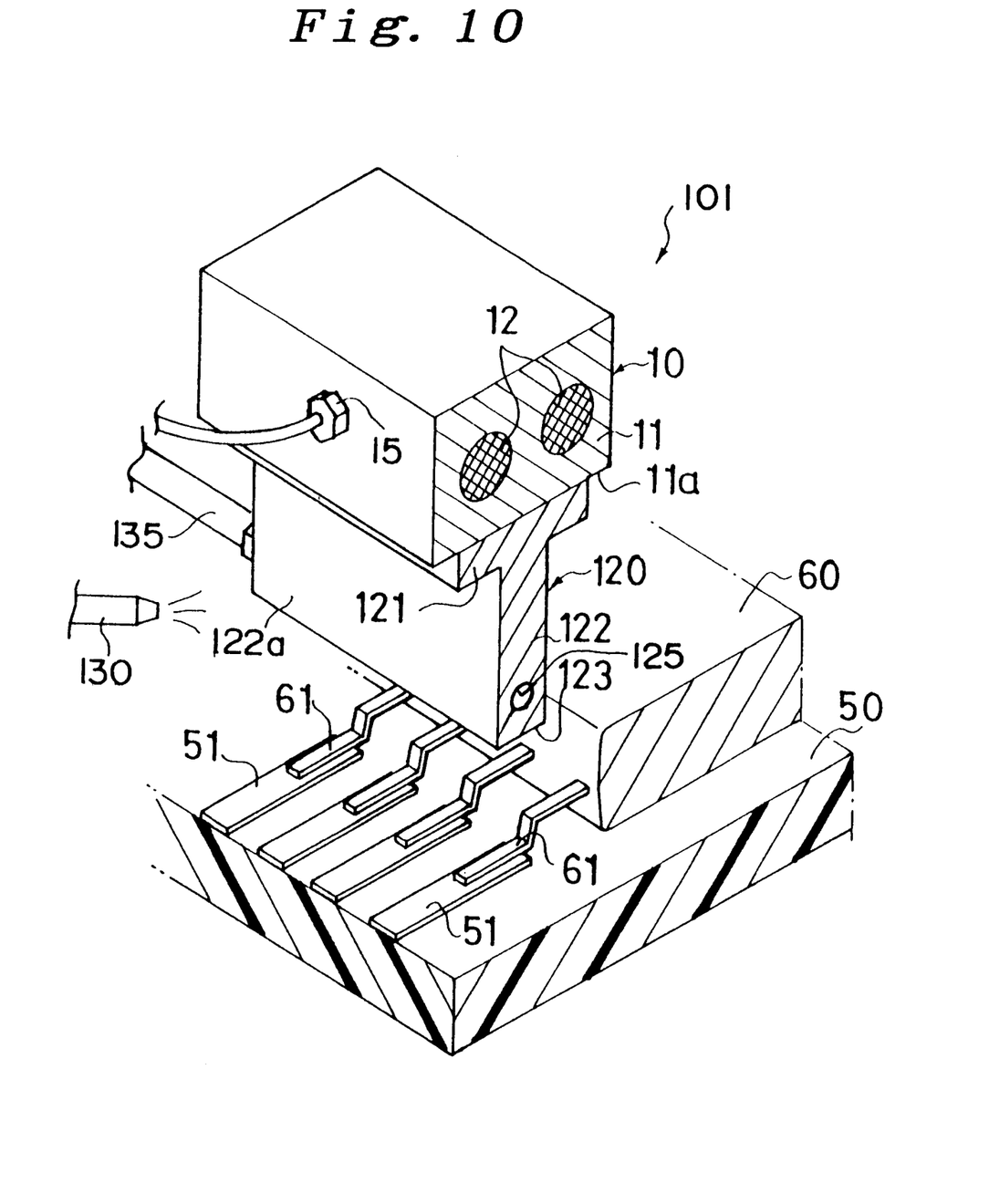
FIG. 10 is a sectional, perspective view showing a heating device which is used in this soldering apparatus and a printed circuit board, which is to be soldered.

FIG. 10 shows the heating device 101 and some other parts in detail. The heating member 10 of the heating device 101 is identical with that used in the apparatus SA of the first embodiment. The heating head 120 has the same outer figure as the heating head 20 of the apparatus SA and includes a mount portion 121, a conductive portion 122 and a contact face 123. However, it has a cooling channel 125, which is formed laterally across the conductive portion 122, near the contact face 123. Pipes 135 are connected to both ends of the cooling channel 125, and a cooling fluid such as air or water is supplied into the cooling channel 125 through the pipes 135. In addition, the apparatus SA' includes an air nozzle 130 for blowing cooling air to the lower portion of the conductive portion 122.

Figure 11:
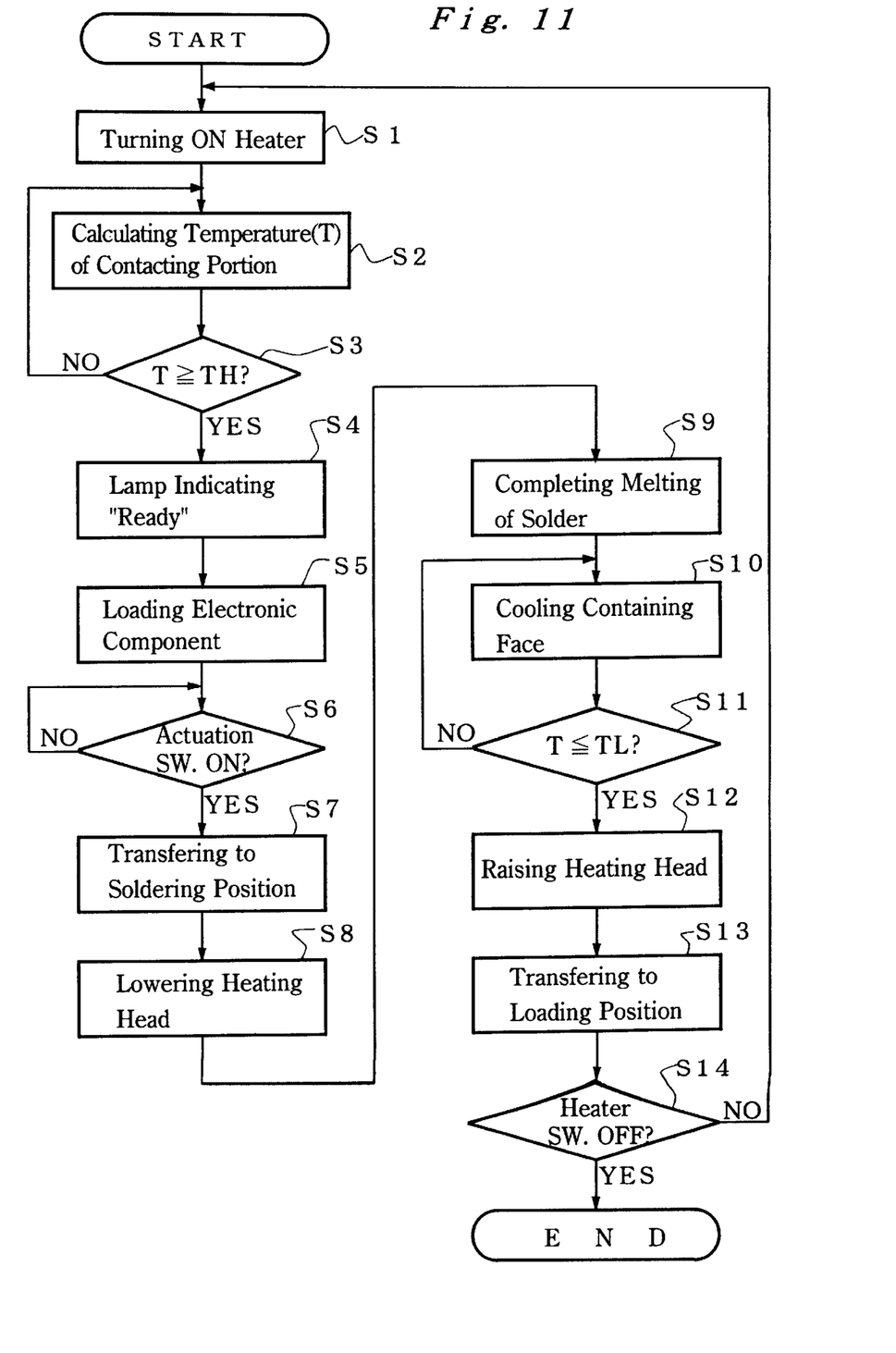
FIG. 11 is a flowchart describing a soldering method which uses this heating device.
Figure 12:
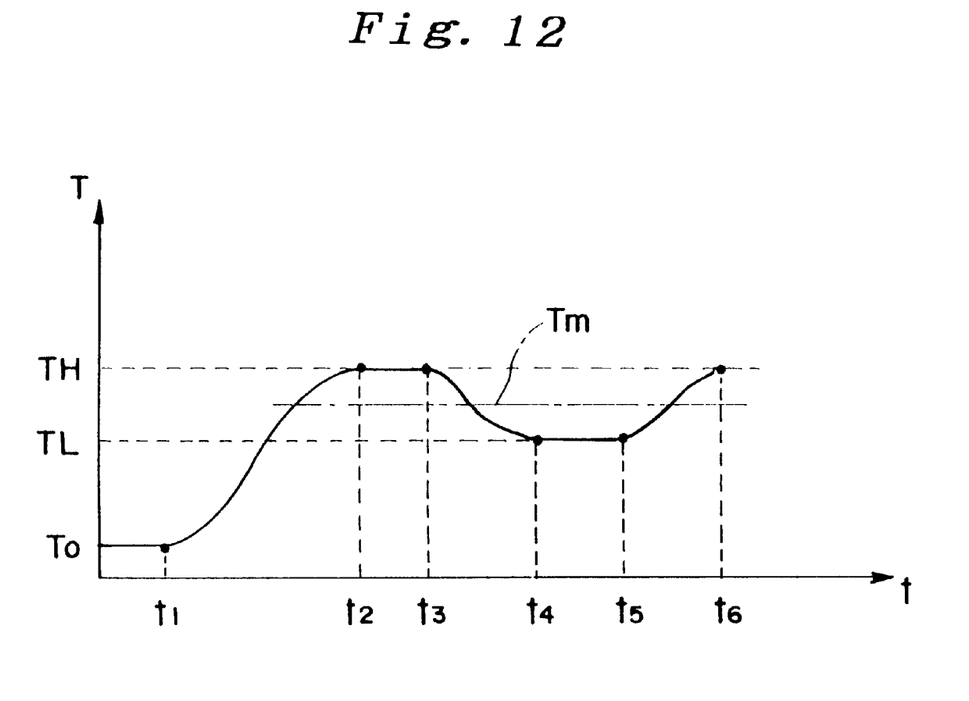
FIG. 12 is a graph showing changes in the temperature of the contact face of this heating device during soldering.

Now, a soldering process carried out with the above soldering apparatus SA' is described with reference to FIG. 11, and changes in the temperature of the contact face 23 is shown in FIG. 12.

First, the heater power switch, which is provided on the front panel, is turned on, and an electrical current is supplied to the heat sources 12. The heat generated by the heat sources 12 heats up the heating head 120 (at step S1). As a result, the temperature of the contact face 123 rises (during the period between time t1 and t2). While the contact face 123 is kept in the air, the temperature of the contact face 23 reaches the temperature TH (referred to as "first predetermined temperature"), which is higher than the melting point Tm of the solder (at time t2), at which the heat Q1 supplied from the heating member 10 to the heating head 120 and the heat Q2 radiated from the heating head 120 balance. When the temperature of the contact face 123, which is calculated from the temperature detected by the thermocouple, is detected to have increased to the temperature TH or above (at steps S2 and S3), a lamp is lighted (at step S4) to indicate that the apparatus is now ready for soldering operation.

Meanwhile, the printed circuit board 50 is mounted on the table 174, which is stationed at the loading position at first. Then, the electronic component 60 is placed at a predetermined position on the printed circuit board 50 (at step S5). This loading work can be completed before the above mentioned lamp for indicating the readiness of the apparatus lights up.

Now, a switch for actuating the apparatus is turned on (at step S6). First, the table 174 is transferred to the soldering position by the X-Y transfer device 170 (at step S7). Next, the heating head 120 is lowered by the pneumatic cylinder 185, and the contact face 123 comes into contact with the leads 61 of the electronic component 60 on the printed circuit board 50 (at step S8). Because of this contact some heat from the heating head 120 is conducted through the contact face 123 to the leads 61, so the solder 55 melts (at time t3). After the solder has melted (at step S9), the lower portion of the heating head 120 and the pathways 51 are cooled (at step 10) by the cooling fluid supplied into the cooling channel 125 through the pipes 135, and by the cooling air blown from the air nozzle 130 to the contact face 123.

Because the heating head 120 is provided with heat-radiating faces 122a, the portion around the contact face 123 is cooled down rapidly by this forced cooling while the heat sources 12 in the heating member 10 are continuously producing heat. After the temperature of the contact face 123 is detected to have lowered to a temperature TL (referred to as "second predetermined temperature") which is below the melting point Tm of the solder (at time t4), the apparatus is kept as is for the elapse of a predetermined time (until time t5). Then, the heating head 120 is lifted by the pneumatic cylinder 185 (at step 12), and the table 174 is returned to the loading position by the X-Y transfer device 170 (at step 13).

At this moment, the supply of the cooling fluid and the blow of the cooling air are cut off. As a result, the temperature of the contact face 123 gradually returns to the first predetermined temperature TH (by time t6). This completes one cycle of soldering process. If the heater power switch is turned off at this point, this control flow of the soldering process comes to an end. However, if the switch is left to be on, the control flow returns from step S14 to step S1. The above described soldering process can be repeated as the electrical current is kept to produce heat.

As described above, the heating head 120 has a high heat conductivity because it is made of aluminium or the like. It has the conductive portion 122 and the contact face 123, which receives forced cooling. As such, it takes a relatively short time for the temperature of the contact face 123 to decline to the second predetermined temperature TL after the solder has been melted by the contact of the heating head 120 with the leads 61 in the soldering process. As such soldering work can be performed efficiently with this apparatus, which uses a constant-heat type heater as heat source.

In the above embodiment, the cooling channel, through which a cooling fluid is supplied, and the air nozzle, from which air is blown, are provided as cooling means. However, only one of them may suffice as cooling means. Moreover, in the above embodiment, the lowering and raising of the heating head and the forced cooling are automatically performed. However, they can be manually operated in a similar manner.

The invention being thus described, it will be obvious that the same may be varied in many ways. Such variations are not to be regarded as a departure from the spirit and scope of the invention and all such modifications as would be obvious to one skilled in the art are intended to be included within the scope of the following claims.

What is claimed is:

1. A soldering apparatus with a constant heat-source, comprising:
    a base composed of a base plate and a column, said column being fixed on said base plate,
    a heating device vertically movably mounted on said column,
    lowering/raising means for moving said heating device up and down along said column, and
    a table horizontally movably provided on said base plate; wherein:
        said heating device includes a heating member with a constant-heat source and a heating head, which is attached to said heating member;
        said heating head is made of a material which has a high heat conductivity, including a mount portion, which is mounted on said heating member, a contact portion, which comes into contact with a part to be soldered of an object, and a conductive portion which is formed connecting said mount portion with said contact portion and which conducts heat supplied from said heating member to said mount portion to said contact portion;
        said table is movable between a loading position and a soldering position on said base plate, said loading position being where said object is loaded or discharged, and said soldering position being where the part to be soldered of said object on said table is located under said heating head;
        while said table loaded with said object is positioned at said soldering position, said heating device is lowered by said lowering/raising means so that said contact portion touches said part, melts solder and solders said part; and,
        wherein: a capacity of said constant-heat source and a shape of said heating head are designed such that: when the heat supplied from said heating member to said mount portion and heat radiated from said heating head balance while said contact portion is in air, a temperature of said contact portion is above the melting point of the solder applied to said part to be soldered; and when the heat supplied from said heating member to said mount portion, the heat radiated from said heating head and heat conducted from said contact portion to said part to be soldered balance while said contact portion is touching said part to be soldered, the temperature of said contact portion is below the melting point of the solder.

2. The soldering apparatus as set forth in claim 1 further comprising cooling means for cooling at least a portion of the heating head near said contact portion and controlling means for controlling operation of said lowering/raising means, wherein:
    said part is soldered as follows: while said table with said object is positioned at said soldering position, said controlling means lowers said heating device so that said contact portion touches said part and melts the solder; said cooling means cools the vicinity of said contact portion; and said controlling means lifts said heating device after the solder at said part has resolidified.

3. The soldering apparatus as set forth in claim 1 further comprising controlling means for controlling operation of said lowering/raising means, wherein:
    said part is soldered as follows:
        while said table with said object is positioned at said soldering position, said controlling means lowers said heating device so that said contact portion touches said part and melts the solder; and
        said controlling means lifts said heating device after said contact portion has cooled down to a temperature below melting point of the solder as a result of heat conduction from said contact portion to said part.

4. The soldering apparatus as set forth in claim 1 or 3 further comprising cooling means for cooling at least a portion of the heating head near said contact portion.

5. A constant-heat, heating device comprising:
    a heating member including a constant-heat source, and
    a heating head, which is attached to said heating member;
    said heating head being made to touch a part to be soldered, whereby solder is melted to solder said part;
    wherein:
        said heating head is made of a material which has a high heat conductivity; and
        said heating head includes:
            a mount portion, which is mounted on said heating member,
            a contact portion, which comes into contact with said part to be soldered, and
            a conductive portion which is formed connecting said mount portion with said contact portion and which conducts heat supplied from said heating member to said mount portion to said contact portion,
        a capacity of said constant-heat source and a shape of said heating head are designed such that:
            when the heat supplied from said heating member to said mount portion and heat radiated from said heating head balance while said contact portion is in air, a temperature of said contact portion is above the melting point of the solder applied to said part to be soldered; and
            when the heat supplied from said heating member to said mount portion, the heat radiated from said heating head and heat conducted from said contact portion to said part to be soldered balance while said contact portion is touching said part to be soldered, the temperature of said contact portion is below the melting point of the solder.

6. The constant-heat heating device as set forth in claim 5 wherein:

said heating head further includes a heat-storing portion for storing heat conducted from said mount portion, said heat-storing portion being provided near said contact portion; and the heat stored in said heat-storing portion is conducted to said part to be soldered so as to sufficiently melt the solder at said part when said contact portion is made to touch said part.

7. The constant-heat, heating device as set forth in claim 5 or claim 6 wherein:

said heating head is made of aluminum or an aluminum alloy.

8. The constant-heat heating device as set forth in claim 5 or claim 6 wherein:

said part to be soldered comprises electrically conductive pathways of a printed circuit board and leads of an electronic component, which leads are placed on said electrically conductive pathways; and said contact portion is made to touch said leads from above so that the solder applied to said electrically conductive pathways melts to solder said electronic component to said electrically conductive pathways.

9. A constant-heat type heating device comprising:

a heating member including a constant-heat source, a heating head, which is attached to said heating member, and cooling means for cooling said heating head; said heating head being made to touch a part to be soldered, whereby solder is melted to solder said part;

wherein:

said heating head is made of a material which has a high heat conductivity;

said heating head includes:

a mount portion, which is mounted on said heating member, a contact portion, which comes into contact with said part to be soldered, a conductive portion which is formed connecting said mount portion with said contact portion and which conducts heat supplied from said heating member to said mount portion to said contact portion;

wherein said cooling means comprises a cooling channel which is formed in said heating head near said contact portion and fluid supplying means which flows a cooling fluid into said cooling channel so that said cooling means cools at least a portion of the heating head near said contact portion.

10. The constant-heat, heating device as set forth in claim 9 wherein:

said cooling means comprises blowing means for blowing cooling air to the vicinity of said contact portion.

11. The constant-heat, heating device as set forth in either one of claims 9~10 wherein:

said heating head is made of aluminum or an aluminum alloy.

12. The constant-heat type heating device as set forth in either one of claims 9~10 wherein:

said part to be soldered comprises electrically conductive pathways of a printed circuit board and leads of an electronic component, which leads are placed on said electrically conductive pathways; and said contact portion is made to touch said leads from above so that the solder applied to said electrically conductive pathways melts to solder said electronic component to said electrically conductive pathways.

* * * * *